US006566230B1

(12) United States Patent
Sachar et al.

(10) Patent No.: US 6,566,230 B1
(45) Date of Patent: May 20, 2003

(54) SHALLOW TRENCH ISOLATION SPACER FOR WEFF IMPROVEMENT

(75) Inventors: Harpreet K. Sachar, Sunnyvale, CA (US); Unsoon Kim, Santa Clara, CA (US); Mark S. Chang, Los Altos, CA (US); Chih Y. Yang, San Jose, CA (US); Jayendra D. Bhakta, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/032,630

(22) Filed: Dec. 27, 2001

(51) Int. Cl.[7] ................................................ H03L 21/76
(52) U.S. Cl. ....................................... 438/435; 438/700
(58) Field of Search ................................ 438/424, 435, 438/700

(56) References Cited

U.S. PATENT DOCUMENTS

| | | | | | |
|---|---|---|---|---|---|
| 5,643,822 | A | * | 7/1997 | Furukawa et al. | 438/421 |
| 5,674,775 | A | * | 10/1997 | Ho et al. | 438/424 |
| 5,753,561 | A | * | 5/1998 | Lee et al. | 438/424 |
| 5,795,811 | A | * | 8/1998 | Kim et al. | 438/424 |
| 5,801,083 | A | * | 9/1998 | Yu et al. | 438/424 |
| 5,882,983 | A | * | 3/1999 | Gardner et al. | 438/424 |
| 5,891,787 | A | * | 4/1999 | Gardner et al. | 438/424 |
| 6,069,057 | A | * | 5/2000 | Wu | 438/424 |
| 6,087,705 | A | * | 7/2000 | Gardner et al. | 257/510 |

FOREIGN PATENT DOCUMENTS

| | | | | |
|---|---|---|---|---|
| JP | 2000-31262 | * | 1/2000 | H01L/21/76 |
| WO | WO 98/09325 | * | 3/1998 | H01L/21/762 |

* cited by examiner

*Primary Examiner*—Carl Whitehead, Jr.
*Assistant Examiner*—David S Blum
(74) *Attorney, Agent, or Firm*—Winstead Sechrest & Minick P.C.

(57) ABSTRACT

A method for performing trench isolation during semiconductor device fabrication is disclosed. The method includes patterning a hard mask to define active areas and isolations areas on a substrate, and forming spacers along edges of the hard mask. Trenches are then formed in the substrate using the spacers as a mask, thereby increasing the width of the substrate under the active areas and increasing Weff for the device.

10 Claims, 4 Drawing Sheets

SHALLOW TRENCH ISOLATION SPACER FOR WEFF IMPROVEMENT

FIELD OF THE INVENTION

The present invention relates to semiconductor processing, and more particularly to a method for performing trench isolation during semiconductor device fabrication.

BACKGROUND OF THE INVENTION

Shallow trench isolation (STI) technology uses shallow, refilled trenches for isolating devices of the same type as replacements for LOCOS isolation. The process begins by depositing a layer of thermal oxide on a silicon substrate and patterning a nitride mask to define active regions on the silicon substrate. Shallow trenches are then etched into the silicon substrate in the openings in the nitride mask between the active areas. A liner oxidation process is performed in the recesses in which a thin layer of thermal oxide is grown. Next, a dielectric oxide (e.g., SiO2) is deposited over the silicon substrate to fill the trenches. This oxide is etched back and polished off until it is at the same level as the nitride mask. Then the nitride mask is stripped to expose the thermal oxide on the active areas and wet etches are done to recess back the dielectric material from the active areas. Thereafter, a layer of polysilicon (Poly1) may be patterned to define floating gate structures for the semiconductor device.

Although the STI process has the advantages of eliminating birds beak of the LOCOS process and of providing a planar surface, the STI process has several drawbacks. FIGS. 1A and 1B are block diagrams showing a cross-sectional view of a silicon substrate 10 processed by the conventional STI process. Shallow trenches 12 have been etched into a silicon substrate between active areas 14 in the substrate under the nitride mask 16. One goal during semiconductor processing is to have the base for the active areas 14 to be as wide as possible to increase W effective (Weff) for the device. Weff being the resulting effective active width after silicon consumption by liner oxidation and various subsequent wet etch cleans and oxidation processes. A wider Weff helps to improve the electrical core gain or drain to source current (Ids) for the device.

While the initial liner oxidation performed in the trenches serve the important purpose of active area corner rounding and the subsequent dip back cleans and oxidation processes are necessary for forming a clean active area surface, they do result in Si consumption, hence reducing the effective active area width (Weff) as shown in FIG. 1B. One solution to achieve a wider Weff is to simply pattern the nitride mask 16 wider to form a wider base for the active area 14. This, however, results in a much narrow region between active areas 14 that may pose lithography patterning limitations.

Accordingly, what is needed is an STI process that improves Weff without posing lithography patterning limitations. The present invention addresses such a need.

SUMMARY OF THE INVENTION

The present invention provides a method for performing trench isolation during semiconductor device fabrication. The method includes patterning a hard mask to define active areas and isolations areas on a substrate, and forming spacers along edges of the hard mask. Trenches are then formed in the substrate using the spacers as a mask.

According to the system and method disclosed herein, forming spacers along the hard mask edges subsequent to the patterning of the hard mask for trench formation results in a wider initial silicon base for the active areas. Consequently, a wider active Si width (Weff) is obtained after liner oxidation and subsequent dip back cleans and oxidations.

BRIEF DESCRIPTION OF THE DRAWINGS

FIGS. 3A–3I are cross-sectional views of the substrate corresponding to the

DETAILED DESCRIPTION

The present invention relates to a method for performing trench isolation during semiconductor device fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

Figure 1A:
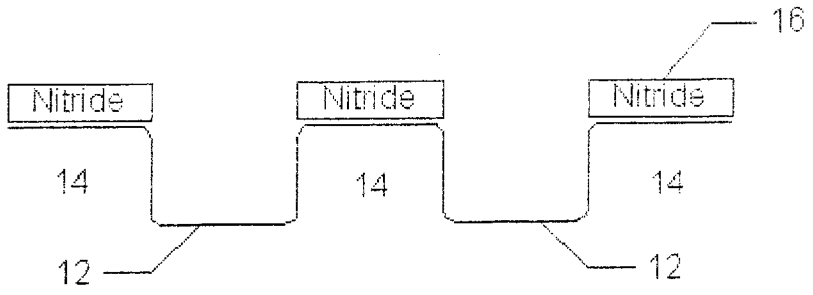
FIGS. 1A and 1B are block diagrams showing a cross-sectional view of a silicon substrate 10 processed by a conventional STI process.
Figure 1B:
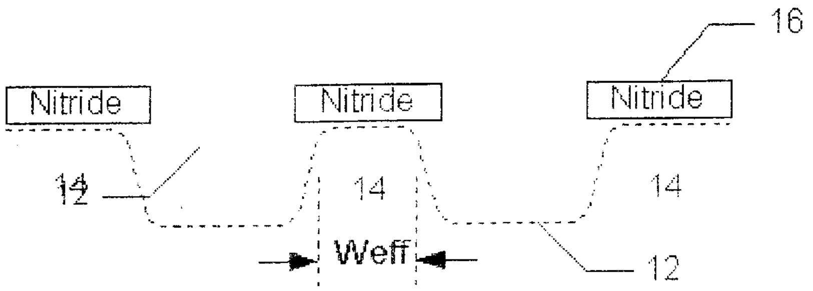
Figure 2:
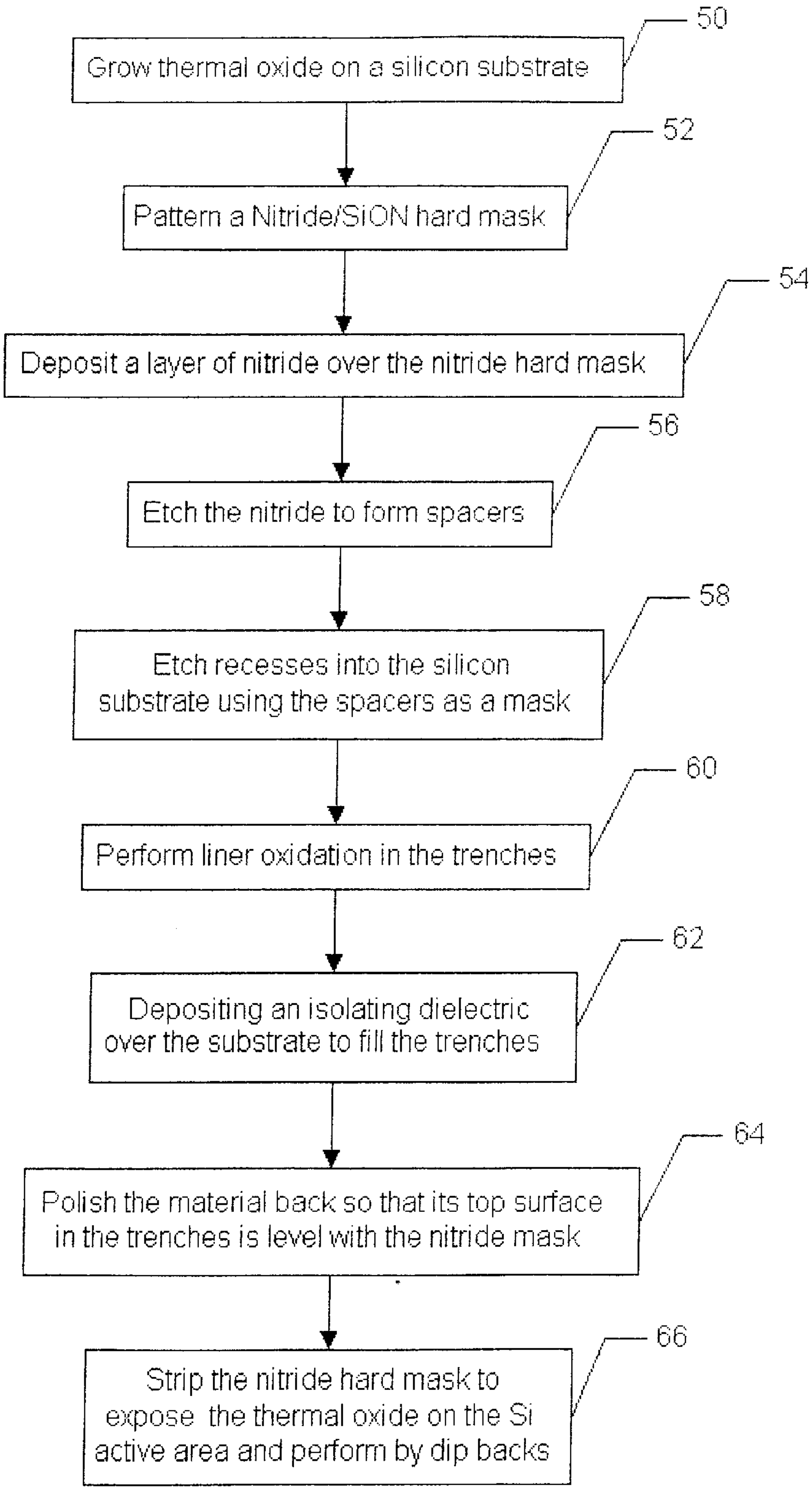
FIG. 2 is a flow chart illustrating the STI spacer process in accordance with one preferred embodiment of the present invention.

The present invention provides a STI spacer to improve the Weff for the device without burdening lithography to define a narrow trench. FIG. 2 is a flow chart illustrating the STI spacer process in accordance with one preferred embodiment of the present invention. FIGS. 3A–3G are cross-sectional views of the substrate corresponding to the steps illustrated in FIG. 2.

Figure 3A:
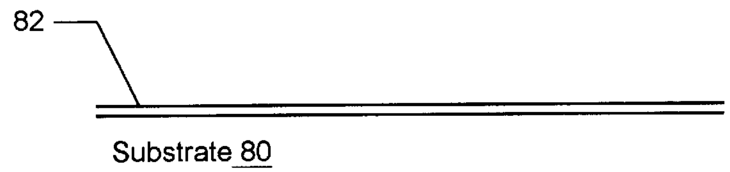
Figure 3B:
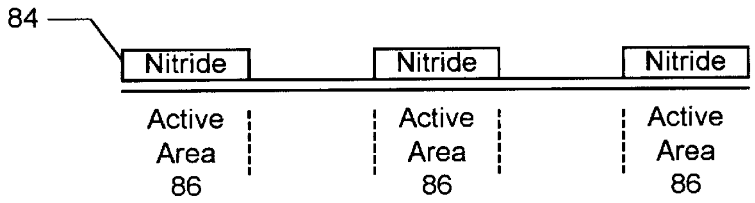

The process begins by growing a thermal oxide 82 on a silicon substrate 80 in step 50 (FIG. 3A). Next, a stack of silicon nitride hard mask and SiON 84 is patterned on the substrate 80 in step 52 (FIG. 3B). The nitride mask 84 is patterned such that the mask 84 protects active areas 86 for the device, while the open areas in the nitride mask 84 defines the locations of STI isolation areas that separate the active areas 86. The nitride 84 may comprise any combination of nitride/oxide/Si rich nitride.

According to the present invention, subsequent to the patterning of the nitride hard mask 84, spacers are formed on each side of the nitride 84 over the active areas 86 so that trench formation will result in a wider silicon base for the active areas 86. Consequently, a wider Si active width (Weff) will be obtained after subsequent dip back cleans and oxidations.

Figure 3C:
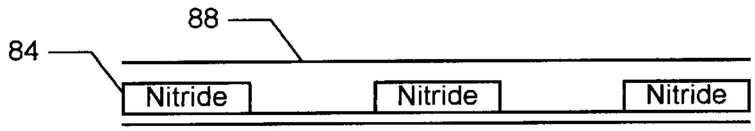
Figure 3D:
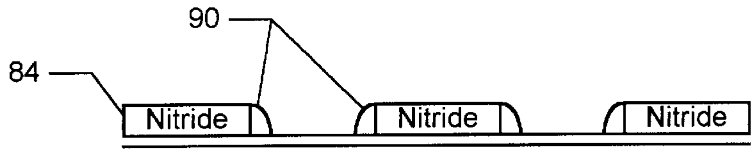
Figure 3E:
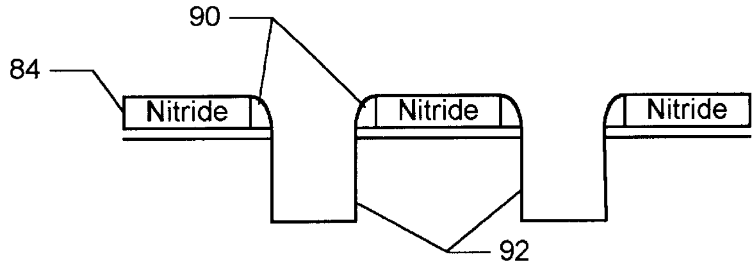

In order to create wider active areas 86, another layer of nitride 88 (or other material, such as oxide or silicon rich nitride) is deposited over the nitride hard mask in step 54 (FIG. 3C). This layer of nitride 88 is then etched to form spacers 90 along the nitride edges to form sidewall extensions in step 56 (FIG. 3D). After the spacers 90 are formed, recesses are etched into the silicon substrate using the spacers as a mask in step 58 to form trenches 92 (FIG. 3E).

Figure 3F:
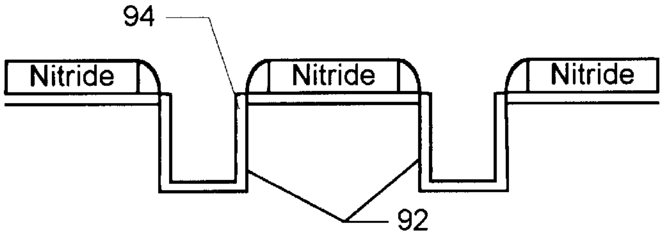
Figure 3G:
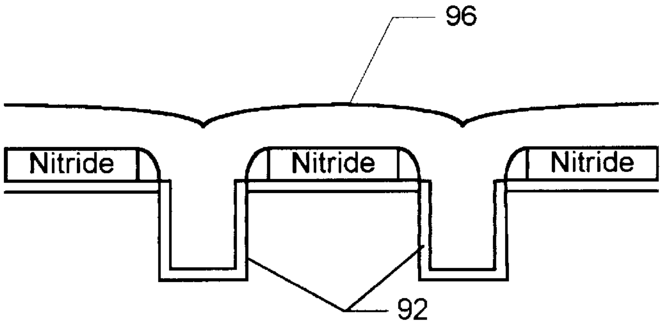
Figure 3H:
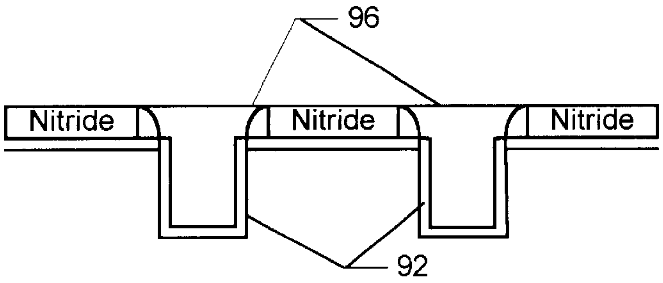
Figure 3I:
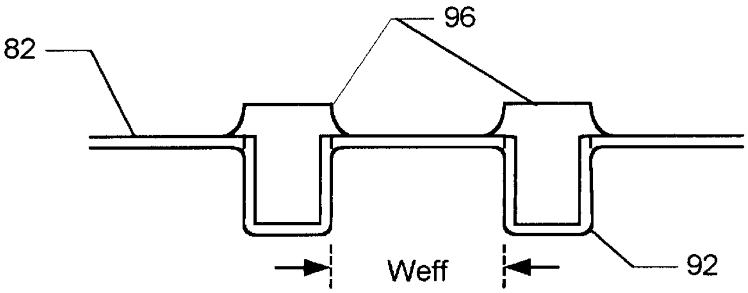

After the trenches 92 have been formed, a liner oxidation is performed in which a thin layer of thermal oxide 94 is grown in the trenches 92 in step 60 (FIG. 3F). The trenches 92 are then filled by depositing an isolation material 96, such as TEOS (tetraethylorthosilane) or HDP, over the substrate in step 62 (FIG. 3G). After the material 96 is deposited, the material 96 is polished back in step 64 so that its top surface in the trenches 92 is level with the nitride mask 84 (FIG. 3H). The nitride hard mask 84 is then stripped to expose the thermal oxide 82 followed by dip back cleans in step 66 (FIG. 3I). The dip backs remove the pre-existing thermal oxide from the surface of the active areas 86 and recess back the isolation oxide to expose more Si and re-grow new thermal oxide on the Si active.

In a preferred embodiment, the spacers 90 are formed as large as possible without creating an aspect ratio for the trenches 92 that exceeds the aspect ratio limitation of whatever trench fill process is being used. Because the spacers 90 result in wider bases for the active areas 86, after the active area 86 recess after the oxidation and dip backs, the width of the active areas 86 remains wider than in the conventional STI process. This results in wider Weff for the device and therefore aids in improving device core gain.

A method for performing STI has been disclosed in which spacers are used to increase the width of the active areas to improve the device Weff. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for performing trench isolation during semiconductor device fabrication, the method comprising the steps of:

(a) patterning a hard mask to define isolations areas between active areas on a substrate;

(b) forming spacers along edges of the hard mask;

(c) forming trenches in the substrate using the spacers as a mask; and (d) stripping the hard mask to expose thermal oxide, and performing dip back cleans, thereby increasing the width of the substrate under the active areas and improving W effective for the device.

2. The method of claim 1 wherein step (b) further includes the steps of:

(i) depositing a first material over the hard mask, and (ii) etching the material to form spacers along the nitride edges to form sidewall extensions.

3. The method of claim 2 wherein step (b)(i) further includes the step of: using nitride as the hard mask and the first material.

4. The method of claim 2 wherein step (c) further includes the step of: performing liner oxidation to grow oxide in the trenches.

5. The method of claim 4 wherein step (c) further includes the step of: filling of the trenches with a second material, and polishing active material so that a top surface of the material in the trenches is level with the hard mask.

6. The method of claim 5 wherein step (a) further includes the step of: growing the thermal oxide on the substrate prior to patterning to the hard mask.

7. A method for performing trench isolation during semiconductor device fabrication, the method comprising the steps of:

(d) growing thermal oxide on a silicon substrate;

(e) patterning a nitride mask to define isolations areas between active areas on the substrate;

(f) depositing a layer of nitride over the nitride hard mask;

(g) etching the nitride to form spacers along the nitride edges;

(h) etching recesses into the silicon substrate using the spacers as a mask to form trenches, wherein trench formation results in a wider silicon base for the active areas;

(i) performing liner oxidation on the trenches;

(j) depositing a material over the substrate, and etching the material such that its top surface in the trenches is level with the nitride hard mask; and (k) stripping the nitride hard mask to expose the thermal oxide, and performing dip back cleans, thereby obtaining a wider active area widths (Weff) for the semiconductor device.

8. The method of claim 7 wherein step (g) further includes the step of: using TEOS as the material.

9. The method of claim 8 wherein step (g) further includes the step of: using HDP as the material.

10. The method of claim 7 further including the step of providing nitride, oxide, or Si rich nitride as the nitride.

* * * * *